( 12 ) United States Patent
Rosenberg et al.

(10) Patent No.: US 12,021,490 B2
(45) Date of Patent: *Jun. 25, 2024

(54) PRE-AMPLIFICATION CONDITIONING CIRCUIT FOR A TRANSDUCER AUDIO DEVICE

(71) Applicant: Logitech Europe S.A., Lausanne (CH)

(72) Inventors: Aron Michael Rosenberg, Lafayette, CA (US); Darrell Hayes, Westlake Village, CA (US); Matthew Fumio Yamamoto, Moorpark, CA (US); Tyler Copeland Barkley, Oak Park, CA (US)

(73) Assignee: Logitech Europe S.A., Lausanne (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/135,060

(22) Filed: Apr. 14, 2023

(65) Prior Publication Data

US 2023/0261617 A1     Aug. 17, 2023

Related U.S. Application Data

(63) Continuation of application No. 17/589,651, filed on Jan. 31, 2022, now Pat. No. 11,711,058.

(51) Int. Cl.
| | |
|---|---|
| *H04R 1/04* | (2006.01) |
| *H03F 3/185* | (2006.01) |
| *H04R 1/28* | (2006.01) |
| *H04R 3/04* | (2006.01) |
| *H04R 7/04* | (2006.01) |
| *H04R 9/08* | (2006.01) |

(52) U.S. Cl.
CPC ............ *H03F 3/1855* (2013.01); *H04R 1/04* (2013.01); *H04R 1/2807* (2013.01); *H04R 3/04* (2013.01); *H04R 7/04* (2013.01); *H04R 9/08* (2013.01); *H03F 2200/03* (2013.01)

(58) Field of Classification Search
CPC ..... H03F 3/1855; H03F 2200/03; H04R 1/04; H04R 1/2807; H04R 3/00; H04R 19/04; H04R 3/04; H04R 7/04; H04R 9/08
USPC ........... 381/120, 122, 175, 28; 330/277, 253
See application file for complete search history.

(56) References Cited

U.S. PATENT DOCUMENTS

2011/0085683 A1*   4/2011  Ejaz ...................... H04R 19/04
                                                              381/174

* cited by examiner

*Primary Examiner* — Norman Yu
(74) *Attorney, Agent, or Firm* — Kilpatrick Townsend & Stockton LLP (57) ABSTRACT

A microphone system includes a microphone and a pre-amplification conditioning circuit configured within a housing and comprising a pair of matched JFETs configured in a differential pair with common-source configuration and, when biased, are operable to receive and amplify the differential microphone output signal. The microphone further includes a pair of BJTs configured as a complimentary feedback transistor pair with each of the pair of BJTs coupled in parallel to a corresponding one of the pair of matched JFETs, and a current sink coupled to the matched JFETs and corresponding emitter electrodes of the BJTs and operable to maintain a fixed total direct current through each of the matched JFETs and BJTs, which reduces the JFETs corresponding electrical load, reduces signal noise, and increases a maximum amplified microphone output signal level at the drains of the matched JFETs.

20 Claims, 5 Drawing Sheets

PRE-AMPLIFICATION CONDITIONING CIRCUIT FOR A TRANSDUCER AUDIO DEVICE

CROSS REFERENCE PARAGRAPH FOR PRIORITY

This application is continuation of U.S. Non-Provisional application Ser. No. 17/589,651, filed on Jan. 31, 2022, and titled "PRE-AMPLIFICATION CONDITIONING CIRCUIT FOR A TRANSDUCER AUDIO DEVICE," which is hereby incorporated by reference in its entirety for all purposes.

BACKGROUND

Microphones are used in myriad applications including mobile phones, live and recorded audio engineering and sound recording, radio and television, consumer electronics and internet-of-things applications, speech recognition, hearing aids, and a host of similar and/or disparate and far-ranging uses. A microphone typically includes at least one transducer configured to convert air pressure variations of a sound wave into an electrical signal.

One common type of microphone is a dynamic microphone. A dynamic microphone is a transducer audio device that converts sound (e.g., mechanical wave energy measured in sound pressure levels ("SPLs")) into an audio signal (e.g., electrical energy) via a moving electrically conductive coil coupled to a diaphragm and a permanent magnetic structure via electromagnetic induction, which is the generation of a voltage (e.g., the audio signal) across an electrical conductor in a changing magnetic field.

Microphone output signals are typically low ("mic level") and can range from <5 mV to 20-30 mV in high output varieties. Some typical consumer electronic devices and standard audio interfaces (e.g., audio mixing console) may operate at line level (e.g., 300+mV), thus mic-level signals often need to be amplified by a "pre-amp" to raise mic levels to line level signals. In practice, some microphone mic level signals are so low that typical off-the-shelf pre-amps cannot amplify those mic level signals to line level, which often necessitates the use of additional expensive amplification systems to accommodate this shortfall, and often these systems may degrade aspects of the audio signal. Better solutions are needed.

BRIEF SUMMARY

In certain embodiments, a microphone system comprises: a housing; a microphone configured within the housing and including a transducer operable to generate a differential microphone output signal at the microphone output based on a detected audio input signal; a pre-amplification conditioning circuit configured within the housing and comprising: a pair of matched junction field-effect transistors (JFETs) configured in a differential pair with common-source configuration and, when biased, operable to: receive the differential microphone output signal at corresponding gate electrodes of the matched JFETs; and generate an amplified microphone output signal at corresponding drain electrodes of the matched JFETs; a pair of bipolar junction transistors (BJTs) configured as a complimentary feedback transistor pair with each of the pair of BJTs coupled in parallel to a corresponding one of the pair of matched JFETs; a current sink coupled to corresponding source electrodes of the matched JFETs and corresponding emitter electrodes of the BJTs, the current sink operable to maintain a fixed total direct current through each of the matched JFETs and BJTs, wherein the BJTs draw current from the corresponding drain electrodes of the matched JFETs, which causes the matched JFETs to: reduce their corresponding electrical load; reduce signal noise generated by the matched JFETs; and increase a maximum amplified microphone output signal level at the drains of the matched JFETs.

The microphone system can further include a phantom power generation circuit configured to generate either 24 V or 48 V of DC phantom power, wherein the pre-amplification conditioning circuit is DC biased via the phantom power generation circuit. The microphone system can further comprise a voltage divider circuit configured to divide the phantom power to bias the gates of the JFETs at 8 V DC. The matched JFETs can be n-channel JFETs and the BJTs can be p-type BJTs. The microphone can be a moving coil or ribbon dynamic-type microphone. The microphone may include a dual diaphragm construction with a resonance chamber, the dual diaphragms are configured in a humbucking configuration operable to reduce common mode electromagnetic and mechanically based signals present on both a positive and negative differential microphone output lines. The system may further comprising a switch circuit configured to be electrically parallel to the microphone output, the switch circuit configured to switch between a first mode of operation and a second mode of operation, wherein when in the first mode of operation, a first filtering circuit is configured to attenuate a natural frequency peak of a frequency response of the microphone in a 4000-5000 Hz range, and wherein when in the second mode of operation, a second filtering circuit is configured to attenuate the natural frequency peak of the frequency response of the microphone in a 5000-7000 Hz range. In some cases, a switch circuit can be configured to be electrically parallel to the microphone output, the switch circuit configured to incorporate a high pass filter set to 100-200 Hz. In some cases, for each of the BJTs: a collector electrode is coupled to a source electrode of the parallel-coupled corresponding JFET; a base electrode is coupled to the drain of the parallel-coupled corresponding JFET; and an emitter electrode is coupled to an output resistor that is series-coupled to the drain of the parallel-coupled corresponding JFET. Certain embodiments may be configured such that the current sink is set to draw a fixed 5 mA of DC current.

In some embodiments, a microphone system comprises: a housing; a microphone configured within the housing and including a transducer operable to generate a differential microphone output signal at the microphone output based on a detected audio input signal; a pre-amplification conditioning circuit configured within the housing and comprising: a pair of matched junction field-effect transistors (JFETs) configured in a differential pair with common-source configuration and, when biased, operable to: receive the differential microphone output signal at corresponding gate electrodes of the matched JFETs; and generate an amplified microphone output signal at corresponding drain electrodes of the matched JFETs; a pair of bipolar junction transistors (BJTs) configured as a complimentary feedback transistor pair with each of the pair of BJTs coupled in parallel to a corresponding one of the pair of matched JFETs; a current sink coupled to corresponding source electrodes of the matched JFETs and corresponding emitter electrodes of the BJTs, the current sink operable to maintain a fixed total direct current through each of the matched JFETs and BJTs; and a phantom power generation circuit configured to generate either 24 V or 48 V of DC phantom power, wherein the pre-amplification conditioning circuit is DC biased via the phantom power generation circuit.

In some cases, the BJTs draw current from the corresponding drain electrodes of the matched JFETs, which causes the matched JFETs to: reduce their corresponding electrical load; reduce signal noise generated by the matched JFETs; and increase a maximum amplified microphone output signal level at the drains of the matched JFETs. The microphone system can include a voltage divider circuit configured to divide the phantom power to bias the gates of the JFETs at 8 V DC. The matched JFETs can be n-channel JFETs and the BJTs can be p-type BJTs. The microphone can be a moving coil or ribbon dynamic-type microphone. The microphone can include a dual diaphragm construction with a resonance chamber, the dual diaphragms may be configured in a humbucking configuration operable to reduce common mode electromagnetic and mechanically based signals present on both a positive and negative differential microphone output lines. The system can further comprise a switch circuit configured to be electrically parallel to the microphone output, the switch circuit configured to switch between a first mode of operation and a second mode of operation, wherein when in the first mode of operation, a first filtering circuit is configured to attenuate a natural frequency peak of a frequency response of the microphone in a 4000-5000 Hz range, and wherein when in the second mode of operation, a second filtering circuit is configured to attenuate the natural frequency peak of the frequency response of the microphone in a 5000-7000 Hz range. The system can include a switch circuit configured to be electrically parallel to the microphone output, the switch circuit configured to incorporate a high pass filter set to 100-200 Hz. For each of the BJTs: a collector electrode is coupled to a source electrode of the parallel-coupled corresponding JFET; a base electrode is coupled to the drain of the parallel-coupled corresponding JFET; and an emitter electrode is coupled to an output resistor that is series-coupled to the drain of the parallel-coupled corresponding JFET. The current sink can be set to draw a fixed 5 mA of DC current.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, although the present system and methods have been specifically disclosed by examples and optional features, modification and variation of the concepts herein disclosed should be recognized by those skilled in the art, and that such modifications and variations are considered to be within the scope of the systems and methods as defined by the present disclosure and appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which.

Throughout the drawings, it should be noted that like reference numbers are typically used to depict the same or similar elements, features, and structures.

DETAILED DESCRIPTION

Aspects of the present disclosure relate generally to audio processing, and more particularly to conditioning a microphone signal for preamplification in an audio signal chain, according to certain embodiments.

In the following description, various examples of pre-amplification conditioning are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high-level summary is intended to provide a basic understanding of some of the novel innovations depicted in the figures and presented in the corresponding descriptions provided below. As noted above, aspects of the invention relate to pre-amplification conditioning of a mic-level audio output signal of a microphones. Some typical microphone types include dynamic microphones and condenser microphones. A dynamic microphone is a transducer audio device that converts sound pressure (e.g., mechanical wave energy measured in SPLs) into an audio signal (e.g., electrical energy) via a moving electrically conductive diaphragm and a permanent magnetic structure via electromagnetic induction, which is the generation of a voltage (e.g., the mic-level audio output signal) across an electrical conductor in a changing magnetic field, as would be appreciated by one of ordinary skill in the art with the benefit of this disclosure, and as further described below at least with respect to FIG. 3. Electromagnetic induction can occur with a fixed conductor and a varying magnetic field, a stationary magnetic field and a moving conductor, or any situation where the relative movement between a magnetic field and a conductor changes. A condenser microphone includes a conductive diaphragm placed close to a conductive backplate, creating a capacitor structure. The capacitor structure may get its electric charge via an external voltage source, such as a battery, power supply, phantom power, or the like, as further described below at least with respect to FIG. 4. The microphone's diaphragm vibrates in response to the mechanical sound energy (SPLs), causing the capacitance to vary, thereby producing a voltage variation, which is the signal output of the microphone.

Microphone ("mic") output signals are typically low ("mic level") and can range from <5 mV in some dynamic-type microphones to as high as 20-30 mV in higher output varieties. However, some typical consumer electronic devices and standard audio interfaces (e.g., audio mixing console) may operate at line level (e.g., 300+mV), thus mic-level output signals often need to be amplified by a preamplifier ("pre-amp") to increase mic levels signals to line level signals. In practice, while pre-amps provide sufficient amplification to most mic-level output signals some microphone mic level signals are so low that typical off-the-shelf pre-amps are not configured to amplify those lower mic-level signals to line level, which often necessitates the use of additional and expensive stand-alone amplification systems to accommodate this deficiency.

Aspects of the invention include a dynamic or condenser microphone with built in pre-amplification conditioning circuit that can operate to condition low mic-level signals such that conditioned mic-level signals are increased to levels that can be sufficiently amplified by an off-the-shelf contemporary preamp device to produce line-level audio signals (e.g., 40-50 dB), operate off of 24 V or 48 V phantom power, filter the mic-level signal for a preferred frequency response (e.g., flat, presence, and/or high pass), with low signal noise generation due to the inclusion of matched junction field effect transistors ("JFETs") configured as an amplification circuit (e.g., matched JFETs may share the same substrate and have a same drain current for zero bias or "Idss" value) with a complimentary pair circuit topology and a pair of bipolar junction transistors ("BJTs") configured as a complimentary feedback transistor pair with each of the pair of BJTs coupled in parallel to a corresponding one of the pair of matched JFETs. The complimentary feedback BJT pair can be biased to operate to reduce amplifier distortion, which allows for higher usable voltage output levels with reduced distortion. The complimentary feedback BJT pair can further reduce their corresponding electrical load of the JFETs, thereby reducing signal noise generated by the matched JFETs, and increasing a maximum amplified microphone output signal level at the drains of the matched JFETs. In some aspects, signal filtering and/or signal shaping circuitry can be applied to the applied mic-level signal for different frequency response characteristics including flat frequency responses, presence boost, high pass filtering, and the like, as would be appreciated by one of ordinary skill in the art with the benefit of this disclosure. It is to be understood that this high-level summary is presented to provide the reader with a baseline understanding of some of the novel aspects of the present disclosure and a roadmap to the details that follow. This high-level summary in no way limits the scope of the various embodiments described throughout the detailed description and each of the figures referenced above are further described below in greater detail and in their proper scope.

Figure 1:
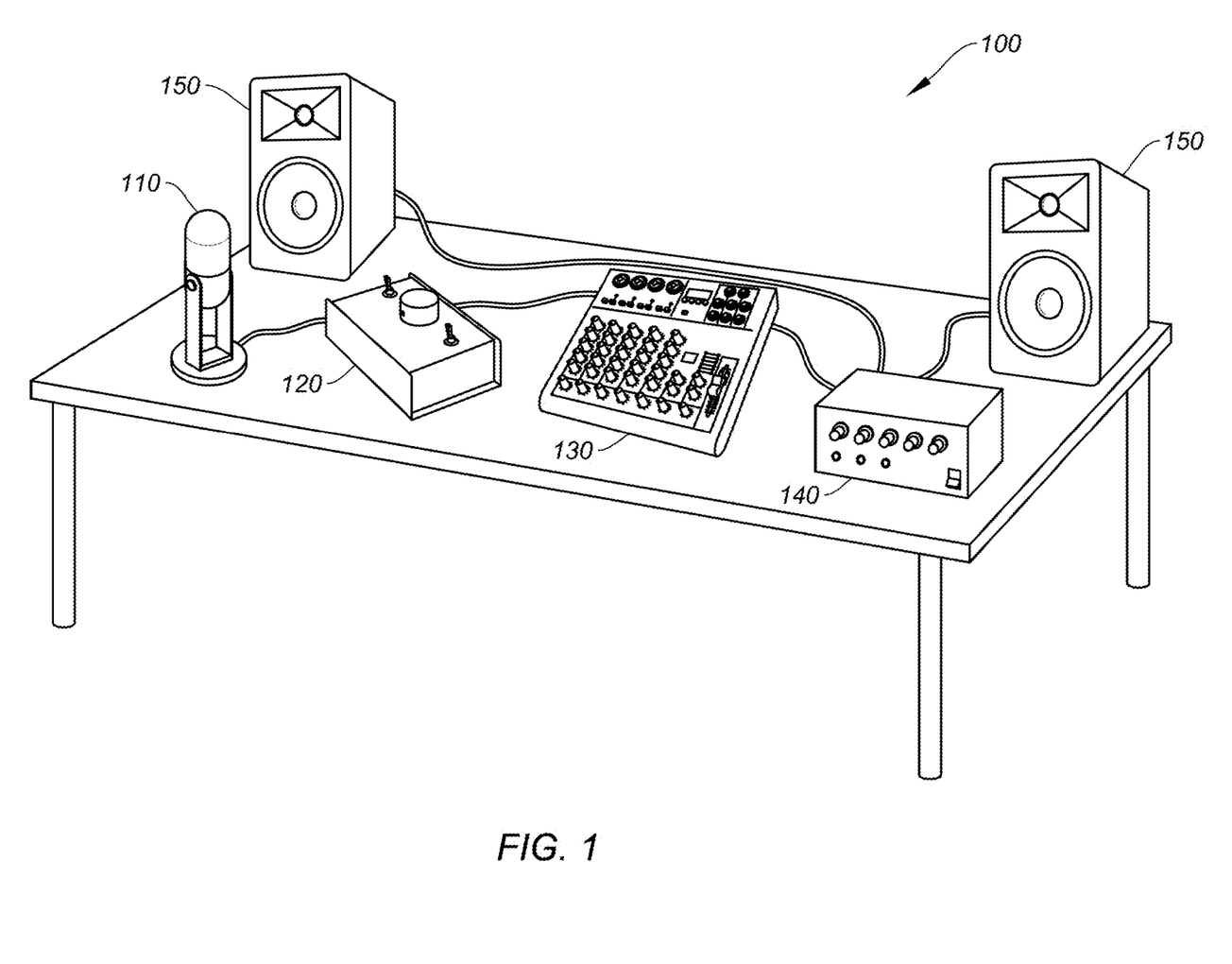
FIG. 1 shows a typical system that can incorporate a pre-amplification conditioning circuit, according to certain embodiments.

FIG. 1 shows a typical system 100 that can incorporate a pre-amplification conditioning circuit, according to certain embodiments. System 100 can include a microphone 110, a preamplifier device 120, an audio mixing deck ("mixer") 130, a power amplifier 140, and passive speakers 150. Other devices may be added (e.g., computer with digital audio workstation, patch bay, effects processor, etc.) or removed from system 100 as needed and is presented for the purpose of showing a typical signal chain for an audio recording system, as would be appreciated by one of ordinary skill in the art with the benefit of this disclosure. Typically, the signal chain starts with a mic-level or instrument-level signal (e.g., <5 mV) that is fed into a preamplifier device that amplifies the Microphone 110 can be a dynamic microphone, ribbon microphone, condenser microphone, or other suitable transducer device configured to convert sound waves into electrical signals (e.g., mic-level signals). Typically, mic-level signals are relatively small alternative current (AC) signals (e.g., <5 mV). Mic-level signals are typically too small to drive a mixing deck, digital audio workstation (DAW), or other processing gear and require some amplification to reach "line level" voltages.

Preamplifier device 120 can be configured as a gain stage operable to amplify the mic-level signals into line-level signals (e.g., typically 1 V, but can range from 300-500 mV to 2 V or more). Preamplifiers typically provide clean amplification to the mic-level signals and generally do not add any appreciable coloration (e.g., harmonic distortion), although some varieties may to introduce desired harmonic characteristics. Preamp devices typically provide 50-60 dB gain to mic-level input signals, which may not be enough to raise certain mic-level output signals to line-level signals that can be processed by DAWs, processors, power amplifiers, or the like. As such, aspects of the invention incorporate a preamplifier conditioning circuit with a microphone device to ensure that the mic-level output signals is of sufficient amplitude such that a typical off-the-shelf preamplifier device can amplify the mic-level signal to a line level range.

Audio mixer 130 is typically configured to receive a line level input signals and provide various mixing capabilities for audio processing. Audio mixer 130 may include an analog-to-digital (A/D) converter to convert the amplified audio signal into a digital format that can be processed via any suitable on-board or off-board functionality including, but not limited to, equalization, panning, fading, mixing, tone control, effects and effects loop control, or other suitable signal processing schema. The output of the audio mixer 130 may be converted back into an analog signal via a digital-to-analog (D/A) converter to drive one or more speakers directly or indirectly through a power amplifier.

Power amplifier 140 can provide an additional gain stage that further amplifies an audio signal to have sufficient amplitude to drive one or more passive speakers 150 (e.g., speakers that do not include a power source). In some cases, power amplifier may be incorporated into the speakers, or in another device (e.g., output stage of audio mixer 130). One of ordinary skill in the art with the benefit of this disclosure would appreciate the many modifications, variations, and alternative embodiments thereof.

Speakers 150 can include any passive or powered set of one or more speakers (e.g., powered studio monitors). Speakers include an electrostatic transducer that converts electrical signals to mechanical sound waves and operates similar to the dynamic microphone in reverse.

Figure 2:
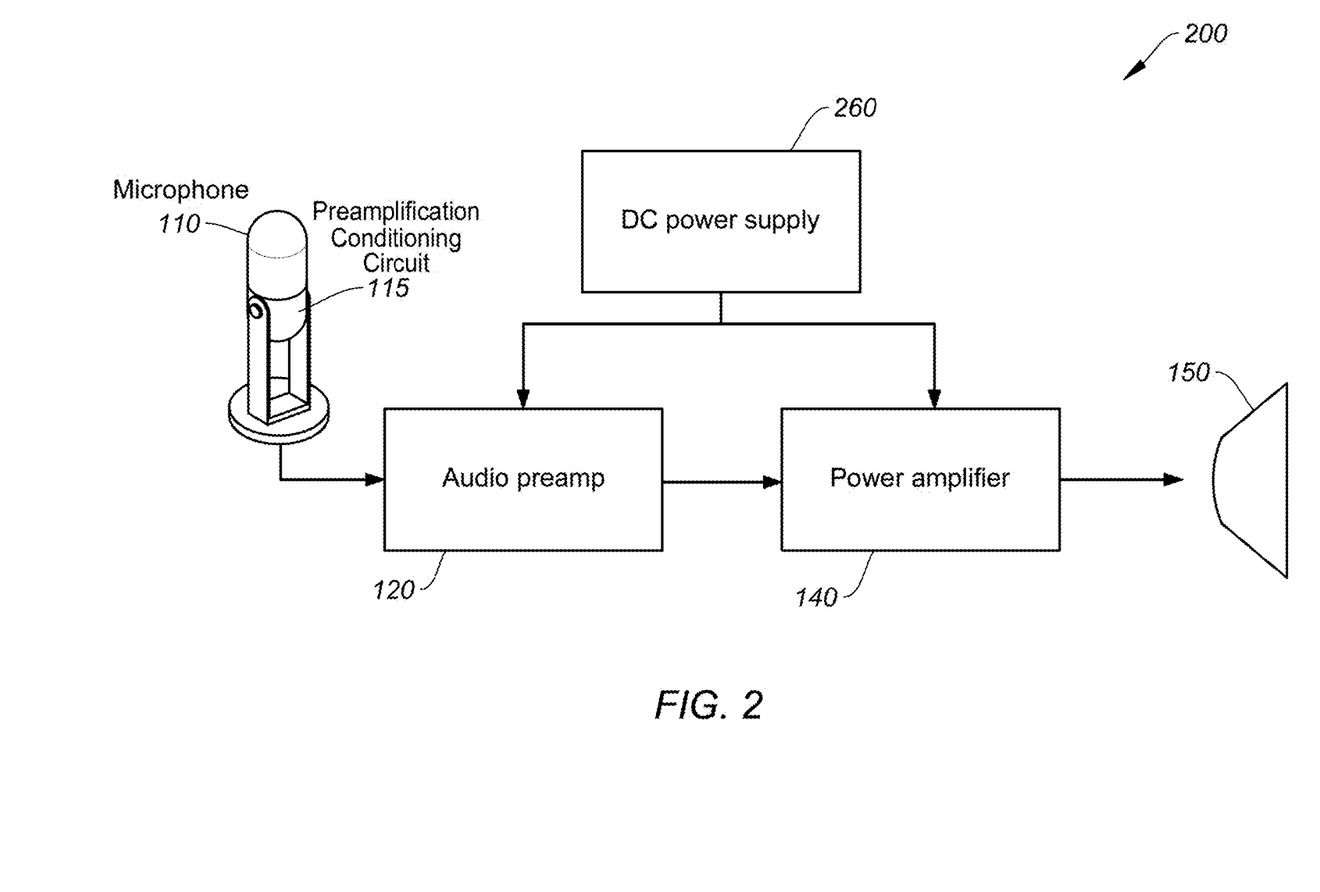
FIG. 2 shows a simplified block diagram a typical microphone amplification system.

FIG. 2 shows a simplified block diagram a typical microphone amplification system 200, which may correspond to aspects of system 100 of FIG. 1. Microphone 110 generates a mic-level signal, which feeds into an audio preamp 120. In some cases, an instrument (e.g., electric guitar or bass) may generate instrument-level signals, which can be processed in the same manner as mic-level signals as described herein. Preamp 120 provides a gain stage to amplify the mic-level input (e.g., 5 mV) to a line-level signal (e.g., 300-500 mV), which may then feed a power amplifier 140 to further amplify the line-level signal to drive speakers 150, or send the line-level signal to another system block (e.g., DAW, mixing console, effects unit, etc.), for further processing. Power supply 260 can be configured to provide power to one or more devices in system 200, which can include DC power to bias preamp and/or power amplifier gain stages and supporting circuitry and the like, as would be appreciated by one of ordinary skill in the art with the benefit of this disclosure. In some aspects, power supply 260 may provide phantom power along one or more signal lines to power certain types of microphones devices (e.g., condenser microphones) or power a preamplification conditioning circuit 115 of (dynamic) microphone 110, according to certain embodiments, and as further described below. In some aspects, DC power supply 260 can be internal to the preamplifier, which may for instance create DC voltage through a boost from 5 V in a USB application or rectification in a mixer application, as would be appreciated by one of ordinary skill in the art with the benefit of this disclosure.

Figure 3:
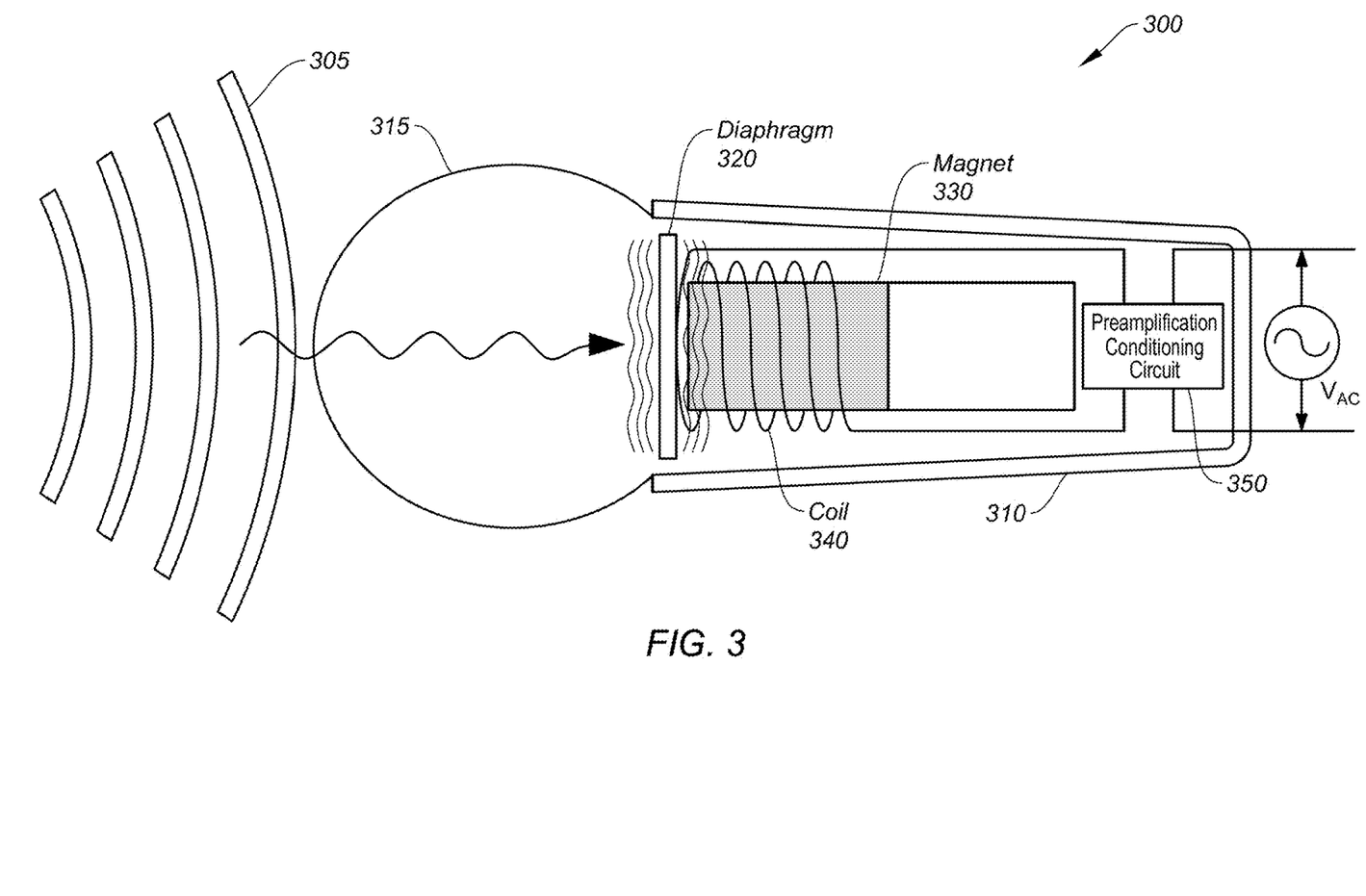
FIG. 3 shows a simplified block diagram of a dynamic microphone with integrated preamplification conditioning circuit, according to certain embodiments.

FIG. 3 shows a simplified block diagram of a dynamic microphone 300 with integrated preamplification conditioning circuit, according to certain embodiments. Dynamic microphone ("Mic") 300 can include a housing 310 containing at least one diaphragm 320, magnet 330, coil 340, and preamplification conditioning circuit 350. As described above, a dynamic microphone is a transducer audio device that converts mechanical wave energy into an electrical audio signal via a moving electrically conductive diaphragm 320 and a permanent magnetic structure via electromagnetic induction. As sound waves impact diaphragm 320, the diaphragm vibrates at a frequency commensurate with the incident sound waves. The diaphragm is physically coupled to coil 340 causing it to vibrate and move relative to stationary magnet 330, thereby generating a mic-level output signal at the differential ends of coil 340 via electromagnetic induction that then feeds into preamplification condition circuit 350 for further signal processing and conditioning, as described below.

In certain embodiments, two diaphragms may be incorporated within housing 310. For example, a first diaphragm can be configured to detect sound waves (sound pressure) in a typical arrangement, as shown in FIG. 3, while a second diaphragm can be separated from the first diaphragm by a resonance chamber and acoustically isolated such that it does not detect any sound pressure, but can be subject to mechanical vibrations of the microphone itself. The two diaphragms can be configured to be 180 degrees out of phase with each other such mechanical vibrations coupled to the two diaphragms cancel each other out, operating as a humbucking system to reduce audio manifestations of mechanical vibrations of the microphone.

Preamplification conditioning circuit (PCC) 350 may be configured as a first gain stage to amplify low mic-level signals to sufficient levels that can be subsequently amplified by a preamplifier circuit to line-level. Additionally, PCC 350 can provide gain with low signal noise for larger mic-level output signals without appreciable signal degradation or other deleterious effects. In other words, the internal preamplification conditioning circuit can be beneficial in that it operates as a preamp designed for low input level signals so it can provide large amplification with extremely low distortion and noise, and because it is internal to the microphone, it provides amplification close to the source to prevent unwanted EMI noise and to get the microphone signal level high enough to improve the signal-to-noise ratio into the next amplification stage. In some aspects, PCC 350 can operate and bias its internal gain stage and supporting circuitry via externally provided phantom power (e.g., 24 V or 48 V), as further described below.

Figure 4:
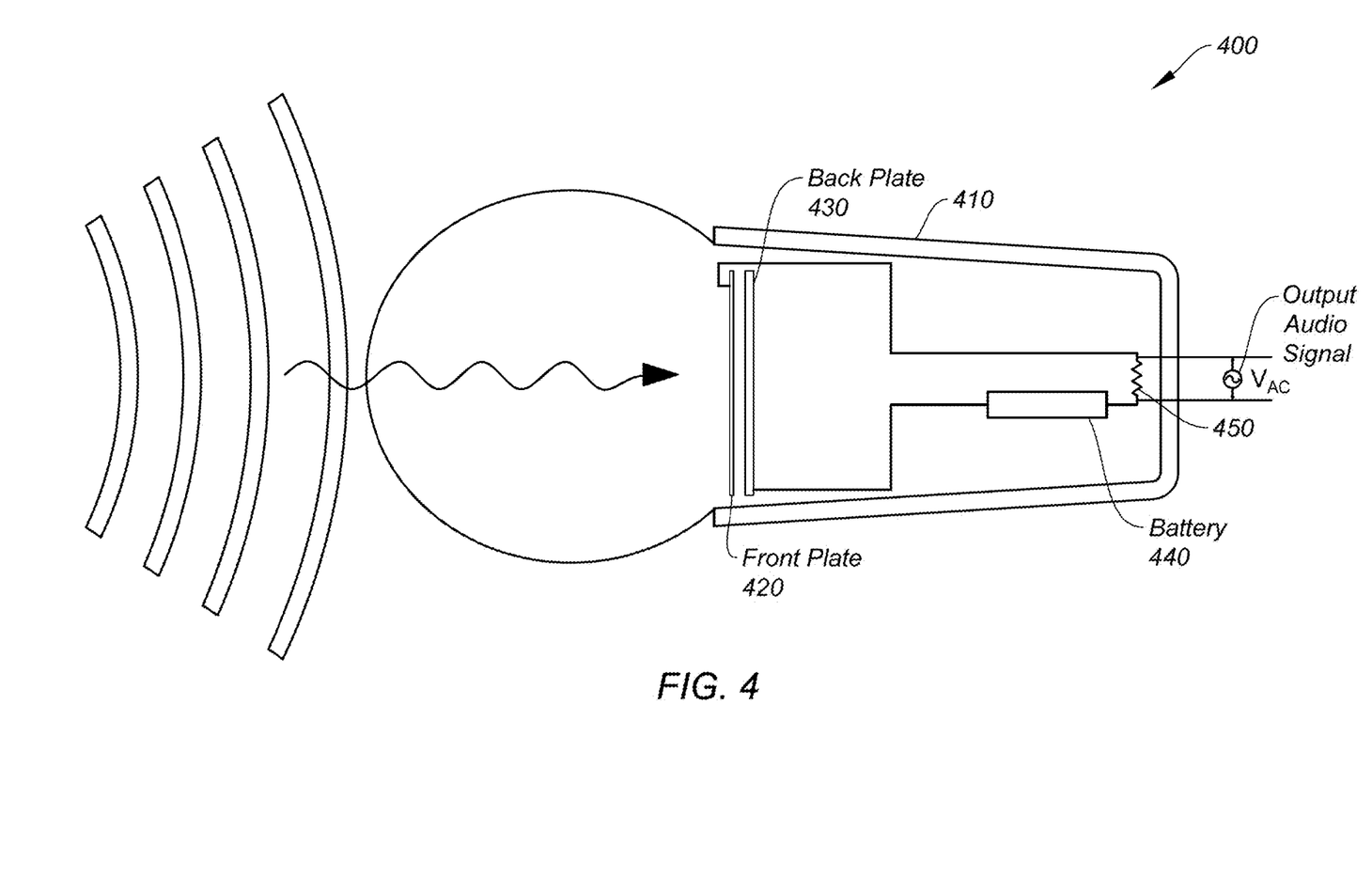
FIG. 4 shows a simplified block diagram of a condenser microphone.

FIG. 4 shows a simplified block diagram of a condenser microphone 400, including a housing 410, front plate 420, back plate 430, battery 440, and load 450. Front plate 420 is separated from back plate 430 by a gap, together forming a capacitor structure. Battery 440 provides an electric charge to back plate 430, although other voltage sources can be used (e.g., externally provided phantom power). Front plate 420 is a diaphragm that vibrates in response to mechanical sound energy, causing the distance between the plates to vary, their corresponding capacitance of vary, and thus a voltage variation across load 450 that operates as the mic-level output signal. Although the embodiments described herein integrate a dynamic microphone with a preamplification conditioning circuit, it should be understood that other microphones, such as condenser or ribbon microphones can be used in a similar manner, as would be appreciated by one of ordinary skill in the art with the benefit of this disclosure.

Figure 5:
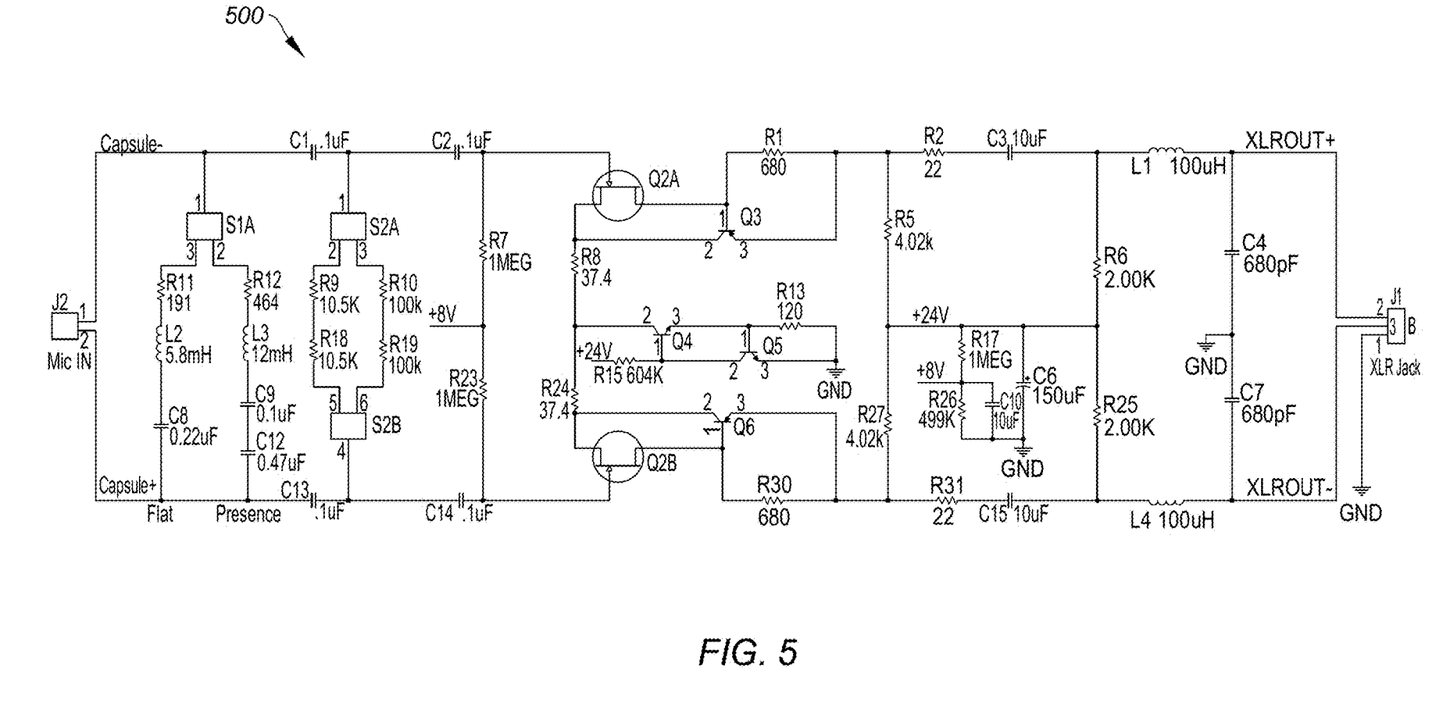
FIG. 5 shows a circuit diagram for a preamplification conditioning circuit, according to certain embodiments.

FIG. 5 shows a circuit diagram for a preamplification conditioning circuit 500, according to certain embodiments. PCC 500 can include a mic input, a filtering bank, a JFET differential amplifier circuit with complementary pair BJTs configured in parallel and a current sink, and an output circuit.

The mic input (J2) includes two wires 1, 2, corresponding to the positive and negative mic-level output signals of the dynamic microphone, and configured as a differential signal. The mic-level output signal can be 1 mV with 600Ω output impedance, which should be coupled to a low-noise amplifier circuit (e.g., circuit 500) for a good signal-to-noise ratio, as is expected in high quality audio equipment. The differential mic-level output signal is fed to two RLC (resistor, inductor, capacitor) circuits to modify the frequency response of the dynamic microphone output. Each of the RLC circuits is selectable via switch S1A, which can be manually (e.g., user manually activates a physical switch) or electrically controlled (e.g., controlled via firmware or software, such as by an off-board computing device). Switch S1A may be a switch circuit configured to be electrically parallel to the differential microphone output, as shown, the switch circuit configured to switch between a first mode and a second mode of operation. In the first mode of operation (the "flat" mode), the RLC circuit of R11, L2, and C8 can be activated and may operate to filter the mic-level output signal from the microphone to attenuate a natural frequency peak of a frequency response of the microphone in the 4000-5000 Hz range to "flatten" the overall frequency response of the microphone. In the second mode of operation (the "presence" mode), a second filtering RLC circuit of R12, L3, and C9 can be activated and may operate to filter the mic-level output signal from the microphone to attenuate the natural frequency peak of the frequency response of the microphone in the 5000-7000 Hz range. The second mode of operation is referred to as "presence" because it removes less of the natural frequency response of the microphone to allow/facilitate a broad peak in the high mid-frequencies to help increase vocal clarity in voice recordings. In addition, the presence filter compensates for the proximity effect of the microphones when the speaker is in close proximity to the diaphragm. The proximity effect is an increase in low-frequency microphone response due to close proximity to the diaphragm.

Switches S2A and S2B can be switched for a frequency response "bass cut" or can be turned "off" using one of two first order RC high pass filters. In a first switch position, capacitors C1 and C13 in combination with the series configured resistors R9 and R18 cause a 150 Hz frequency response roll off ("bass cut") and operates as a high pass filter. In a second switch position, capacitors C1 and C13 in combination with series configured resistors R10 and R19 causes a 16 Hz roll off, which for all practical purposes is "off" as 16 Hz outside the human hearing range.

Transistors Q2A and Q2B are a matched pair of N-Channel JFETs configured in a common source configuration. The amplifier is inverting so the negative side of the deferential input is sent to the amplifier and the output is sent to the positive side of the XLR output. An 8V DC bias voltage is applied to the gate of each JFET via a voltage divider network of resistors R23 and R7. The values of resistors R23 and R7 are typically set to be at least 1 MΩ to ensure that almost no current flows into the gate (e.g., typically <10 μA). Capacitors C2 and C14 are configured to operate as DC blocking capacitors to prevent the 8V DC bias voltage from reaching and potentially damaging the switches. Capacitors C2 and C14 also form a high pass filter along with resistors R7 and R23 also creates an high pass RC filter with R7 and R23, which typically does not materially affect the frequency response of the microphone as the frequency is typically below 20 Hz.

Transistors Q3 and Q6 are configured as a complimentary feedback pair and are typically PNP BJTs. The complimentary feedback pair can operate to reduce noise of the circuit and increase the gain of the differential amplifier with minimal impact to harmonic distortion.

Transistors Q4 and Q5 form a current sink, which is configured to ensure that constant current flows through the JFET amplifier regardless of voltage changes or fluctuations. Thus, the circuit can run off of 24 or 48 V DC phantom power, while the current through the JFET differential amplifier circuit remains substantially constant (e.g., 5 mA), provided that they remain property biased (e.g., the JFETs and BJTs do not reach their corresponding cut off regions, as would be appreciated by one of ordinary skill in the art with the benefit of this disclosure). In some preferred embodiments, the amount of current designed for the current sink can be a maximum amount or near-maximum amount that stays in the ohmic region of the JFETs without saturating them. Circuit 500 may be configured to operate with a current sink running at a lower current, but this may cause higher distortion and noise. A characteristic of a JFET is the Idss, which defines where the Saturation, Ohmic, and Cut off regions of the transistor. In some aspects, the Idss current can be configured to be as much as we can supply and that will not saturate the transistor or cause them to enter the breakdown region, and as close to the Idss rating as possible to achieve superior performance.

Resistor R13 is configured to set the amount of current through the current sink and resistor R15 sets biasing. Resistors R30 and R1 set the current through the complementary feedback pair (e.g., at 1 mA) and may be adjusted to increase or decrease the current. Resistors R5 and R8 set the gain of the JFET differential amplifier (e.g., 25 dB). This is matched to the other side of the differential JFET amplifier (with the gain being set by resistors R27 and R24) so the gain is the same on both sides. Resistors R2 and R31 set the output impedance of the system (e.g., 22 Ωs, which is a standard across certain XLR-type microphones. Capacitors C3 and C15 operate as DC blocking caps, which separate the amplifier voltage and phantom power voltage, and also forms an RC high pass filter with the input impedance of the interface the microphone is connected too, which typically ranges from 1 KΩ to 100 KΩ. Resistors R17 and R26 are a voltage divider network that creates the 8V rail for the gates of the JFETs. Capacitor C10 is used as a bypass cap to provide additional smoothing since microphone bias is a typical place noise is injected. Capacitor C6 can be configured as a bypass capacitor that can operate to remove the AC signal from the power rail. Resistors R6 and R25 sum the two phantom power rails to a single rail and create a voltage drop across them due to the current consumption of the system. Inductors L4/L1 and capacitors C4/C7 create a second order low pass filter, which can remove high frequency noise from the system. The output of the system can include a balanced XLR jack having two balanced conductors with a third common ground, which can be tied to the shield of the cable, the microphone ground, and the interface ground.

To place the integrated preamplification conditioning circuit in context, consider that many dynamic microphones do not output a mic-level signal output level that is high enough for many consumer grade Analog-to-Digital converters to process. The very low voltage levels may sound too quiet for users, who may have to resort to high end external preamplifiers and additional corresponding cables to accommodate the deficiencies of very low mic-level outputs. Certain embodiments of the preamplification conditioning circuit include a differential JFET amplifier with parallel configured complimentary feedback pair of BJTs, powered by a selectable 24 or 48 V Phantom Power, and is directly integrated into a microphone such that a dynamic microphone can be used with consumer grade A/D converters. In some aspects, the preamplification conditioning circuit can be configured external to the microphone. It should be noted that the circuit configuration of the complimentary pair of BJTs is preferably over other configurations, such as a Darlington pair, due to improved linearity and comparatively lower total harmonic distortion characteristics.

As described above, the preamplification conditioning circuit includes a gain stage that utilizes a pair of matched JFETs with a complementary feedback pair of BJTs configured as part of the feedback circuit of the JFETs, which allows for a fully differential amplifier with common mode rejection from input to output. The amplifier is powered from phantom power (e.g., +24 V or +48 VDC), which is a DC voltage received from an external interface on the same rails (conductive lines) that the AC mic-level output signal resides (e.g., XLR Jack; J1 of FIG. 5). Phantom power is present on both the + and − side of the differential output so there is no potential difference between the + and − signal. In some embodiments, phantom power is a low power specification, which delivers 7 mA per side at 48 V by limiting the current through a 6.8 KΩ resistor on the interface or the device providing phantom power. Once phantom power is received by the microphone, it is summed to a power rail via resistors R6 and R25 to create a single power rail. The power rail is then filtered by capacitor C6 to remove or reduce any AC signal for a more steady state DC power supply. The two power rails are realized with a voltage divider comprised of resistors R17 and R26, which creates a 24V DC supply and a 8V DC bias supply ("mic bias"), which biases the JFET transistors. As described above, the gain stage of PCC 500 includes transistors Q2A, Q2B, Q3, Q4, Q5, and Q6, along with supporting passive components including resistors R1, R5, R7, R8, R13, R15, R23, R24, R27, and R30. Each side of the gain stage is set up as a common source JFET amplifier, with the mic-level output signal of the microphone configured as the input into the gate of the JFET, the drain of the JFETs are the signal output, and the common coupled sources of the JFETs are electrically coupled to ground. As such, the differential microphone signal enters the matched N-Channel JFET pair (Q2A, Q2B) via the gate which is DC biased ("mic bias") through resistors R7 and R23. A high value of resistor should be chosen to ensure very little current enters the gate (e.g., 8 μA; preferably less than 10 μA) and further sets the input impedance of the amplifier gain stage. Resistors R5 and R27 are used to set the drain current of the amplifier and are used in conjunction with resistors R8 and R24 to set the amplifier gain, which can be 25 dB as shown in FIG. 5, although any suitable gain value can be set by design.

As noted above, the matched pair JFET common source differential amplifier design is paired with a pair of PNP BJTs to create a complementary feedback pair (e.g., transistors Q6 and Q3 in FIG. 5). The current through the BJT transistors is set by resistors R30 and R1, which is 1 mA in FIG. 5, however other suitable current values can be set by design. Typically, in phantom power-based designs, the current often ranges from 0.5 mA-4 mA. The complementary feedback pair operates to increase the gain of the amplifier while keeping harmonic distortion low, which allows for higher maximum sound pressure levels. That is, the headroom of the amplifier output is increased. The complimentary feedback pair increases the beta value of the amplifier, improves linearity and reduces total harmonic distortion (THD), thereby providing for a higher output voltage due to the reduced THD. The complementary feedback pair provides improved harmonic distortion characteristics and increased maximum SPL with a tradeoff of negligible additional noise on the amplified mic-level output signal (e.g., <1 nV). A current sink is configured in the tail of the amplifier (e.g., source side of JFETs) in a common mode configuration, which can cancel noise generated by the current sink. The current sink is comprised up of transistors Q4, Q5 and resistors R13, R15. Transistor Q4 is biased by resistor R15, which biases transistor Q5. The current of the circuit is set by resistor R13, which is set at 4.2 mA in some implementations. This allows 2.1 mA of current per side of the amplifier, where 1 mA is dedicated to the complementary feedback pair and 1.1 mA is given to the JFET. This creates an amplifier that is low power, with high gain, low distortion, good linearity, low noise, and capable of achieving a high maximum SPL.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A microphone system comprising:
   a housing;
   a microphone configured within the housing and including a transducer operable to generate a differential microphone output signal at the microphone output based on a detected audio input signal;
   a pre-amplification conditioning circuit configured within the housing and comprising:
      a pair of matched junction field-effect transistors (JFETs) configured in a differential pair with common-source configuration and, when biased, operable to:
         receive the differential microphone output signal at corresponding gate electrodes of the matched JFETs; and
         generate an amplified microphone output signal at corresponding drain electrodes of the matched JFETs;
      a pair of bipolar junction transistors (BJTs) configured as a complimentary feedback transistor pair with each of the pair of BJTs coupled in parallel to a corresponding one of the pair of matched JFETs;
      a current sink coupled to corresponding source electrodes of the matched JFETs and corresponding emitter electrodes of the BJTs, the current sink operable to maintain a fixed total direct current through each of the matched JFETs and BJTs,
      wherein the BJTs draw current from the corresponding drain electrodes of the matched JFETs, which causes the matched JFETs to:
         reduce their corresponding electrical load;
         reduce signal noise generated by the matched JFETs; and
         increase a maximum amplified microphone output signal level at the drains of the matched JFETs; and
   a phantom power generation circuit configured to generate either 24 V or 48 V of DC phantom power,
   wherein the pre-amplification conditioning circuit is DC biased via the phantom power generation circuit.

2. The microphone system of claim 1 wherein the matched JFETs are n-channel JFETs and the BJTs are p-type BJTs.

3. The system of claim 1 wherein the microphone is a moving coil or ribbon dynamic-type microphone.

4. The system of claim 1 further comprising a switch circuit configured to be electrically parallel to the microphone output, the switch circuit configured to switch between a first mode of operation and a second mode of operation,
   wherein when in the first mode of operation, a first filtering circuit is configured to attenuate a natural frequency peak of a frequency response of the microphone in a 4000-5000 Hz range, and
   wherein when in the second mode of operation, a second filtering circuit is configured to attenuate the natural frequency peak of the frequency response of the microphone in a 5000-7000 Hz range.

5. The system of claim 1 wherein for each of the BJTs:
   a collector electrode is coupled to a source electrode of the parallel-coupled corresponding JFET;
   a base electrode is coupled to the drain of the parallel-coupled corresponding JFET; and
   an emitter electrode is coupled to an output resistor that is series-coupled to the drain of the parallel-coupled corresponding JFET.

6. A microphone system comprising:
   a housing;
   a dynamic-type microphone configured within the housing and including a transducer operable to generate a differential microphone output signal at the microphone output based on a detected audio input signal;
   a pre-amplification conditioning circuit configured within the housing and comprising:
      a pair of matched junction field-effect transistors (JFETs) configured in a differential pair with common-source configuration and, when biased, operable to:
         receive the differential microphone output signal at corresponding gate electrodes of the matched JFETs; and
         generate an amplified microphone output signal at corresponding drain electrodes of the matched JFETs;
      a pair of bipolar junction transistors (BJTs) configured as a complimentary feedback transistor pair with each of the pair of BJTs coupled in parallel to a corresponding one of the pair of matched JFETs;
      a current sink coupled to corresponding source electrodes of the matched JFETs and corresponding emitter electrodes of the BJTs, the current sink operable to maintain a fixed total direct current through each of the matched JFETs and BJTs; and
   a phantom power generation circuit configured to generate either 24 V or 48 V of DC phantom power,
   wherein the pre-amplification conditioning circuit is DC biased via the phantom power generation circuit.

7. The microphone system of claim 6 wherein the BJTs draw current from the corresponding drain electrodes of the matched JFETs, which causes the matched JFETs to:
   reduce their corresponding electrical load;
   reduce signal noise generated by the matched JFETs; and increase a maximum amplified microphone output signal level at the drains of the matched JFETs.

8. The microphone system of claim 6 further comprising a voltage divider circuit configured to divide the phantom power to bias the gates of the JFETs at 8 V DC.

9. The microphone system of claim 6 wherein the matched JFETs are n-channel JFETs and the BJTs are p-type BJTs.

10. The microphone system of claim 6 wherein the microphone is a moving coil or ribbon dynamic-type microphone.

11. The microphone system of claim 6 further comprising a switch circuit configured to be electrically parallel to the microphone output, the switch circuit configured to switch between a first mode of operation and a second mode of operation,
wherein when in the first mode of operation, a first filtering circuit is configured to attenuate a natural frequency peak of a frequency response of the microphone in a 4000-5000 Hz range, and
wherein when in the second mode of operation, a second filtering circuit is configured to attenuate the natural frequency peak of the frequency response of the microphone in a 5000-7000 Hz range.

12. The microphone system of claim 6 further comprising a switch circuit configured to be electrically parallel to the microphone output, the switch circuit configured to incorporate a high pass filter set to 100-200 Hz.

13. The microphone system of claim 6 wherein for each of the BJTs:
a collector electrode is coupled to a source electrode of the parallel-coupled corresponding JFET;
a base electrode is coupled to the drain of the parallel-coupled corresponding JFET; and
an emitter electrode is coupled to an output resistor that is series-coupled to the drain of the parallel-coupled corresponding JFET.

14. The microphone system of claim 6 wherein the current sink is set to draw a fixed 5 mA of DC current.

15. A microphone system comprising:
a housing;
a microphone configured within the housing;
a pre-amplification conditioning circuit configured within the housing and comprising:
a pair of matched junction field-effect transistors (JFETs) configured in a differential pair with common-source configuration and, when biased, operable to:
receive a differential microphone output signal at corresponding gate electrodes of the matched JFETs; and
generate an amplified microphone output signal at corresponding drain electrodes of the matched JFETs; and
a pair of bipolar junction transistors (BJTs) configured as a complimentary feedback transistor pair with each of the pair of BJTs coupled in parallel to a corresponding one of the pair of matched JFETs,
wherein for each of the BJTs:
a collector electrode is coupled to a source electrode of the parallel-coupled corresponding JFET;
a base electrode is coupled to the drain of the parallel-coupled corresponding JFET; and
an emitter electrode is coupled to an output resistor that is series-coupled to the drain of the parallel-coupled corresponding WET.

16. The microphone system of claim 15 wherein the BJTs draw current from the corresponding drain electrodes of the matched JFETs, which causes the matched JFETs to:
reduce their corresponding electrical load;
reduce signal noise generated by the matched JFETs; and
increase a maximum amplified microphone output signal level at the drains of the matched JFETs.

17. The microphone system of claim 15 wherein the microphone is a moving coil or ribbon dynamic-type microphone.

18. The microphone system of claim 15 further comprising: a phantom power generation circuit configured to generate either 24 V or 48 V of DC phantom power,
wherein the pre-amplification conditioning circuit is DC biased via the phantom power generation circuit.

19. The microphone system of claim 15 wherein the matched JFETs are n-channel JFETs and the BJTs are p-type BJTs.

20. The microphone system of claim 15 further comprising a switch circuit configured to be electrically parallel to the microphone output, the switch circuit configured to switch between a first mode of operation and a second mode of operation,
wherein when in the first mode of operation, a first filtering circuit is configured to attenuate a natural frequency peak of a frequency response of the microphone in a 4000-5000 Hz range, and
wherein when in the second mode of operation, a second filtering circuit is configured to attenuate the natural frequency peak of the frequency response of the microphone in a 5000-7000 Hz range.

\* \* \* \* \*